United States Patent
Tai et al.

(10) Patent No.: US 7,965,015 B2
(45) Date of Patent: Jun. 21, 2011

(54) LAMB WAVE DEVICE

(75) Inventors: Tomoyoshi Tai, Inazawa (JP); Masahiro Sakai, Nagoya (JP); Yukihisa Ohsugi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 32 days.

(21) Appl. No.: 12/618,914

(22) Filed: Nov. 16, 2009

(65) Prior Publication Data
US 2010/0123367 A1    May 20, 2010

(30) Foreign Application Priority Data

Nov. 19, 2008 (JP) .................. 2008-295819
Oct. 8, 2009 (JP) .................. 2009-234028

(51) Int. Cl.
*H01L 41/08* (2006.01)
(52) U.S. Cl. .......... 310/313 R; 310/313 B; 310/313 A
(58) Field of Classification Search ............. 310/313 R, 310/313 A, 313 B
See application file for complete search history.

(56) References Cited

U.S. PATENT DOCUMENTS

| | | | |
|---|---|---|---|
| 7,528,685 B2* | 5/2009 | Tanaka ................... | 333/195 |
| 7,535,152 B2 | 5/2009 | Ogami et al. | |
| 2007/0188047 A1* | 8/2007 | Tanaka ................... | 310/313 D |
| 2007/0199186 A1 | 8/2007 | Yoshino et al. | |
| 2009/0231061 A1* | 9/2009 | Tanaka ................... | 333/195 |
| 2010/0064492 A1* | 3/2010 | Tanaka ................... | 29/25.35 |
| 2010/0237742 A1* | 9/2010 | Tanaka ................... | 310/313 D |
| 2010/0237959 A1* | 9/2010 | Tanaka ................... | 331/158 |

FOREIGN PATENT DOCUMENTS

| | | |
|---|---|---|
| JP | 2007-228319 A1 | 9/2007 |
| WO | 2007/046236 A1 | 4/2007 |

OTHER PUBLICATIONS

K. Mizutani and Kohji Toda: "Analysis of Lamb Wave Propagation Characteristics in Rotated Y-Cut X-Propagation LiNbO$_3$ Plates", IEICE Transactions, vol. J68-A No. 5, May 1985, pp. 496-503 (with concise explanation of relevance, as authored by Applicants' Japanese representatives).

Kohji Toda and K. Mizutani: "Propagation Characteristics of Plate Waves in a Z-Cut X-Propagation LiTaO$_3$ Thin Plate", IEICE Transactions, vol. J71-A No. 6, Jun. 1988, pp. 1225-1233 (with concise explanation of relevance, as authored by Applicants' Japanese representatives).

* cited by examiner

*Primary Examiner* — Mark Budd
(74) *Attorney, Agent, or Firm* — Burr & Brown

(57) ABSTRACT

There is provided a lamb wave device with small variations in frequency, the device including: a piezoelectric thin film; an IDT electrode which is provided on a main surface of the piezoelectric thin film; and a support structure which supports a laminate of the IDT electrode and the piezoelectric thin film, and is formed with a cavity that isolates the laminate, wherein a film thickness h of the piezoelectric thin film and a pitch p of a finger of the IDT electrode are selected such that a lamb wave is excited at a target frequency, the lamb wave making dispersibility of a sonic velocity v with respect to the film thickness h of the piezoelectric thin film small.

6 Claims, 11 Drawing Sheets

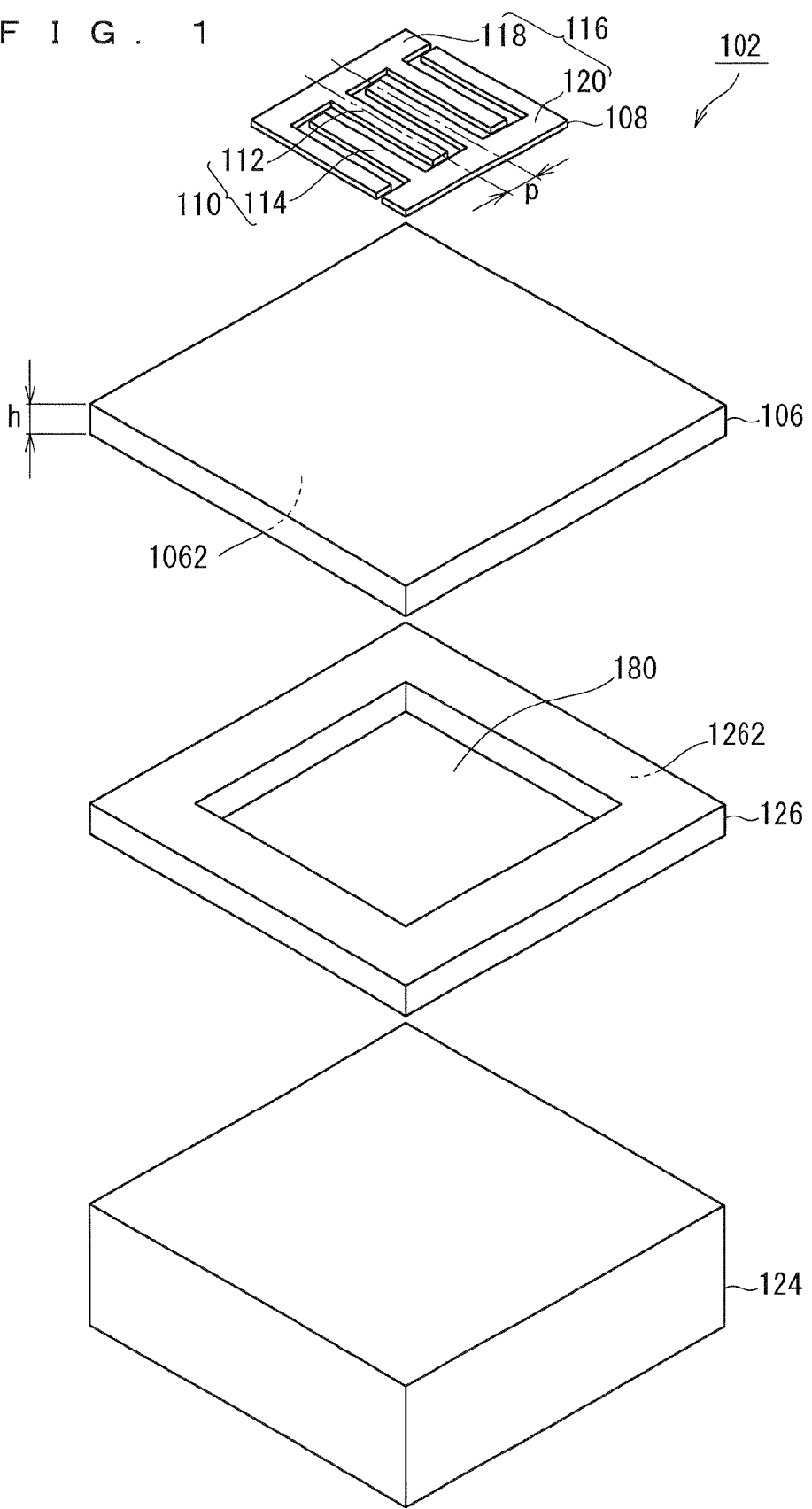
F I G. 1

F I G. 2
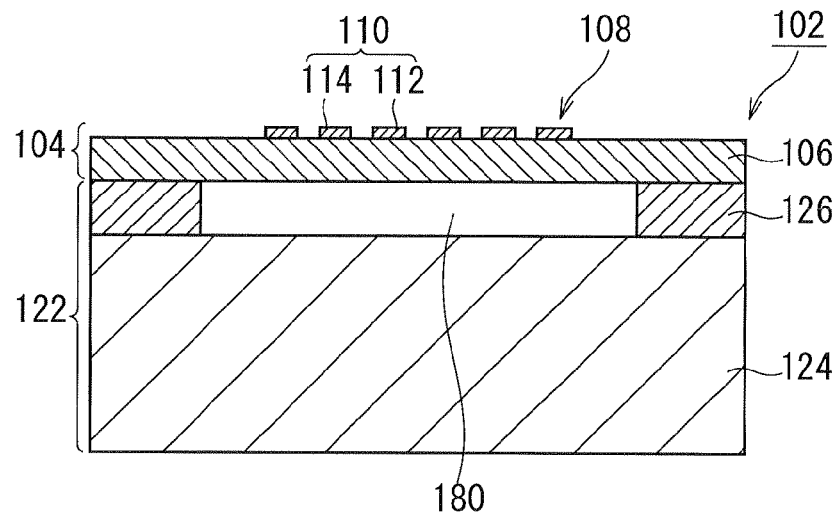
F I G. 3
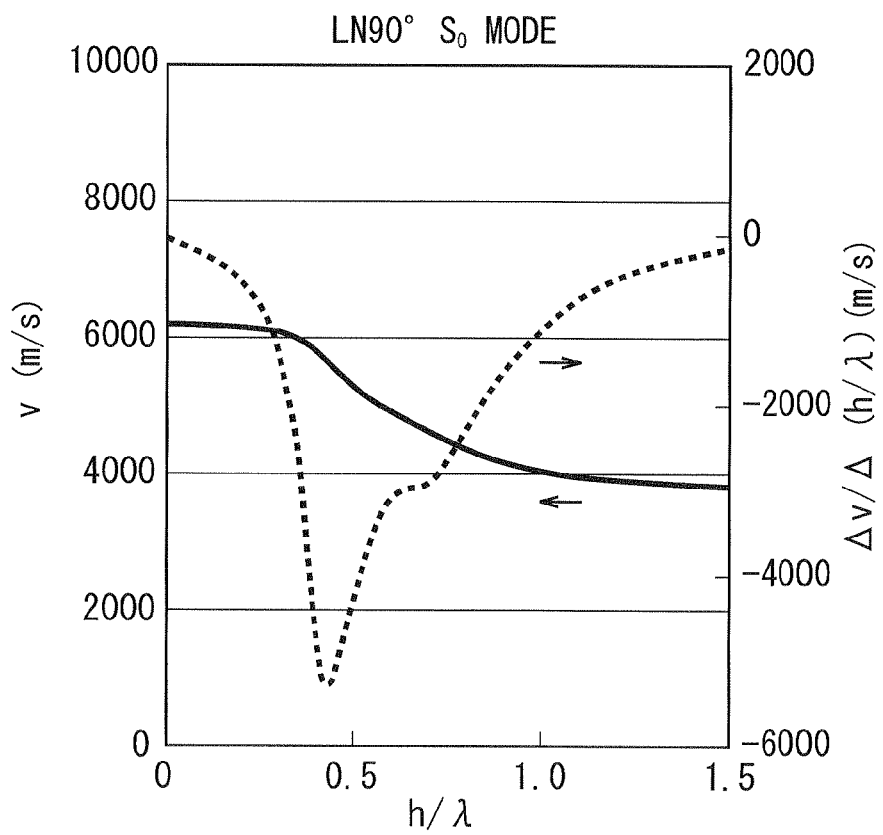

| SUPPORT FILM | PIEZOELECTRIC THIN FILM | ETCHING RATE RATIO (%) | FREQUENCY VARIATIONS (%) |
|---|---|---|---|
| SiO$_2$ | LN36 | 0.18 | 0.5 |
| SiO$_2$ | LN45 | 0.97 | 0.7 |
| SiO$_2$ | LN90 | 2.30 | 0.9 |
| LN90 | LN36 | 7.98 | 1.8 |
| LN90 | LN45 | 42.70 | 4.2 |
| LN90 | LN90 | 100.00 | 11.0 |

| SUPPORT FILM | PIEZOELECTRIC THIN FILM | ETCHING RATE RATIO (%) | FREQUENCY VARIATIONS (%) |
|---|---|---|---|
| LN36 | LN36 | 100 | 9.2 |
| LN36 | LT36 | 28 | 3.5 |
| LN36 | LT40 | 88 | 7.8 |
| LN36 | LT42 | 126 | 12.6 |

LAMB WAVE DEVICE

BACKGROUND OF THE INVENTION

1. Field of the Invention

The present invention relates to a lamb wave device which excites a lamb wave in a piezoelectric thin film.

2. Description of the Background Art

Japanese Patent Application Laid-Open No. 2007-228319 discloses a bulk acoustic wave device that excites thickness longitudinal vibration or thickness-shear vibration in a piezoelectric thin film obtained by removal processing on a piezoelectric substrate. In this bulk acoustic wave device, since a frequency is inversely proportional to a film thickness of the piezoelectric thin film, in order to make the frequency high, it is necessary to reduce the film thickness of the piezoelectric thin film. For example, in order to set the frequency to several GHz, it is necessary to set the film thickness of the piezoelectric thin film to approximately several μm depending upon a piezoelectric material constituting the piezoelectric thin film.

However, when the film thickness of the piezoelectric thin film becomes as thin as several a problem arises where variations in film thickness that occur due to variations in processing cause large variations in frequency.

On the other hand, International Publication No. 2007-046236 discloses a lamb wave device that excites a lamb wave in a piezoelectric thin film. In this lamb wave device, an influence exerted by variations in film thickness upon variations in resonant frequency is smaller than in the case of the foregoing bulk acoustic wave device.

SUMMARY OF THE INVENTION

However, also in International Publication No. 2007-046236, the influence exerted by variations in film thickness upon variations in resonant frequency does not become an ignorable level. This is because a sonic velocity of the lamb wave has dispersibility with respect to the film thickness of the piezoelectric thin film. The present invention was made to solve the above problem, and aims at providing a lamb wave device with small variations in frequency.

According to a first aspect of the present invention, a lamb wave device includes: a piezoelectric thin film; an IDT electrode which is provided on a main surface of the piezoelectric thin film; and a support structure which supports a laminate of the piezoelectric thin film and the IDT electrode, wherein a film thickness h of the piezoelectric thin film and a pitch p of a finger of the IDT electrode are selected such that a lamb wave, with which an absolute value of a change coefficient $\Delta v/\Delta (h/\lambda)$ of a sonic velocity v with respect to a ratio $h/\lambda$ of the film thickness h of the piezoelectric thin film to a wavelength $\lambda$ is not larger than 2000 m/s, is excited at a target frequency.

Since an influence exerted by the film thickness of the piezoelectric thin film upon the sonic velocity of the lamb wave becomes small, variations in frequency become small.

A vibration mode of the lamb wave is preferably an $S_0$ mode.

According to a second aspect of the present invention, in the lamb wave device of the first aspect, the support structure includes: a support substrate; and a support film which bonds the support substrate and the laminate, and is also formed with a cavity that isolates an excitation section of the laminate from the support substrate, and an orientation of the piezoelectric thin film is selected such that an etching rate of the main surface on the support structure side of the piezoelectric thin film to a solution containing hydrogen fluoride or a gas containing hydrogen fluoride at 65° C. is not larger than one half of that of the main surface on the support substrate side of the support film.

Since etching of the piezoelectric thin film is suppressed in formation of the cavity in the support structure, variations in resonant frequency become further small.

According to a third aspect of the present invention, in the lamb wave device of the first aspect, the support structure includes a support substrate, and an orientation of the piezoelectric thin film is selected such that an etching rate of the main surface on the support structure side of the piezoelectric thin film to a solution containing hydrogen fluoride or a gas containing hydrogen fluoride at 65° C. is not larger than one half of that of the main surface on the opposite side to the piezoelectric thin film side of the support substrate.

Since etching of the piezoelectric thin film is suppressed in formation of the cavity in the support structure, variations in resonant frequency become further small.

Accordingly, the present invention aims at making variations in frequency of a lamb wave device small.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an exploded perspective view of a lamb wave device of a first embodiment.

FIG. 2 is a sectional view of the lamb wave device of the first embodiment.

FIGS. 3 and 4 are dispersion curves of an $S_0$ mode in a case of a piezoelectric material being lithium niobate.

DESCRIPTION OF THE PREFERRED EMBODIMENTS

Figure 4:
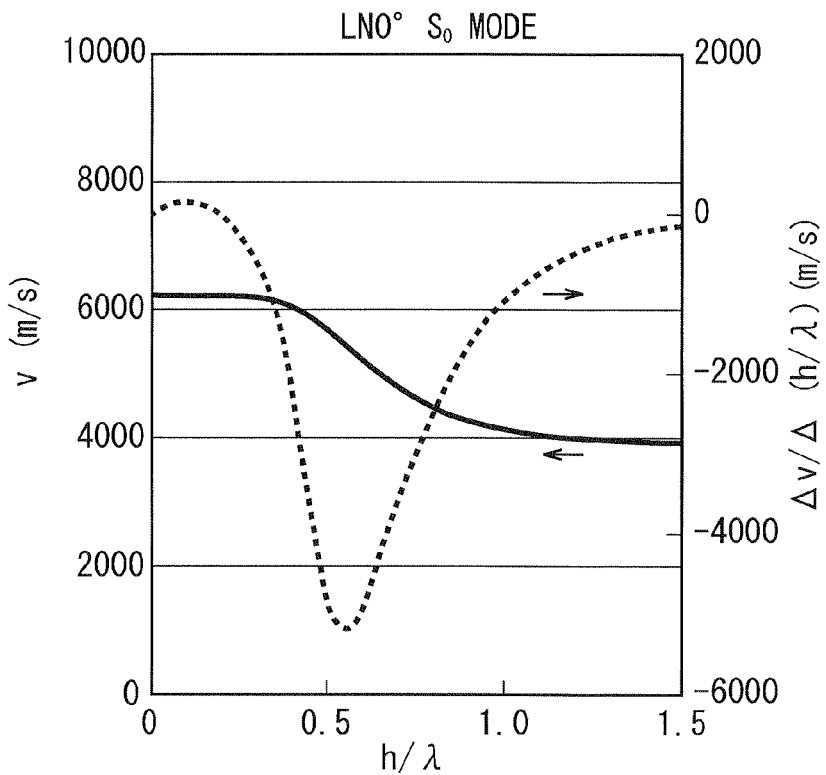

1 First Embodiment 1-1 Configuration of Lamb Wave Device 102

FIGS. 1 and 2 are schematic views of a lamb wave device 102 of a first embodiment. FIG. 1 is an exploded perspective view of the lamb wave device 102, and FIG. 2 is a sectional view of the lamb wave device 102.

As shown in FIGS. 1 and 2, the lamb wave device 102 has a structure in which a support structure 122 supports a laminate 104. The laminate 104 is provided with a piezoelectric thin film 106 and an IDT electrode 108 that excites a lamb wave in the piezoelectric thin film 106. The support structure 122 is provided with a support substrate 124 and a support film 126 that bonds the support substrate 124 and the laminate 104. In the support film 126 formed is a cavity 180 that isolates an excitation section of the laminate 104 from the support substrate 124. The IDT electrode 108 is provided inside a region where the cavity 180 is formed (hereinafter referred to as a "cavity region").

{Film Thickness h of Piezoelectric Thin Film 106 and Pitch p of Finger 110 of IDT Electrode 108}

It is desirable to select a film thickness h of the piezoelectric thin film 106 and a pitch p of a finger 110 of the IDT electrode 108 such that a lamb wave is excited at a target frequency, the lamb wave making dispersibility of a sonic velocity v with respect to the film thickness h of the piezoelectric thin film 106 small. It is particularly desirable to make the selection such that a lamb wave is excited at a target frequency, the lamb wave making an absolute value of a change coefficient $\Delta v/\Delta (h/\lambda)$ of the sonic velocity v with respect to a ratio $h/\lambda$ of the film thickness h of the piezoelectric thin film 106 to a wavelength $\lambda$, namely an absolute value of a differential coefficient $dv/dx$ of a sonic velocity $v(x)$ with respect to x when $x=h/\lambda$, not larger than 2000 m/s. Thereby, since the influence exerted by the film thickness h of the piezoelectric thin film 106 upon the sonic velocity v of the lamb wave becomes small, the variations in frequency become small.

In order to make the change coefficient $\Delta v/\Delta (h/\lambda)$ small, the film thickness h of the piezoelectric thin film 106 may be made sufficiently smaller than the wavelength $\lambda$ of the lamb wave decided based upon the pitch p of the finger 110 of the IDT electrode 108.

Figure 5:
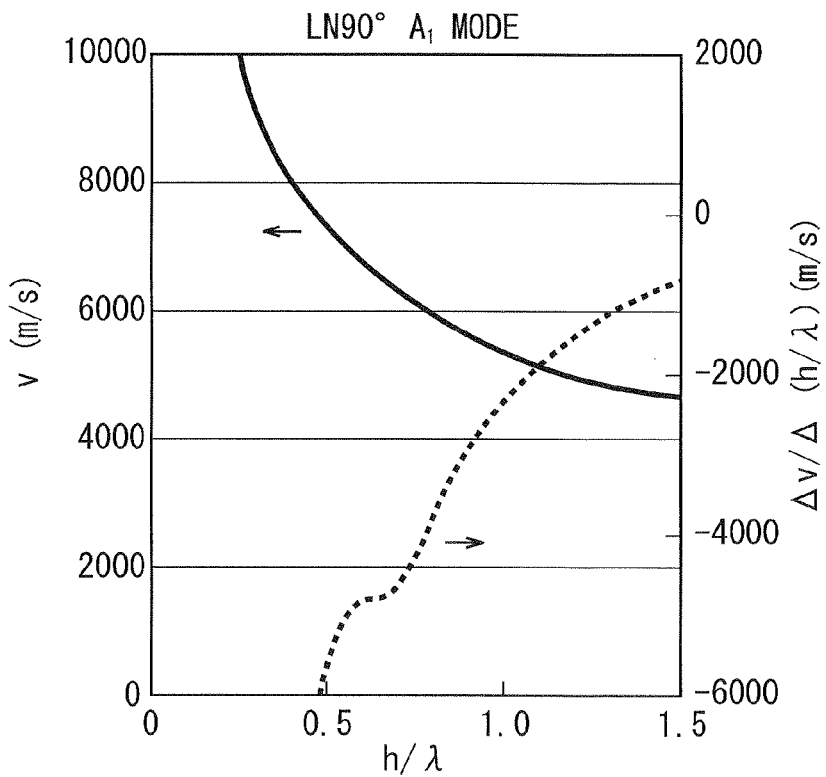
FIG. 5 is a dispersion curve of an $A_1$ mode in the case of the piezoelectric material being lithium niobate.
Figure 6:
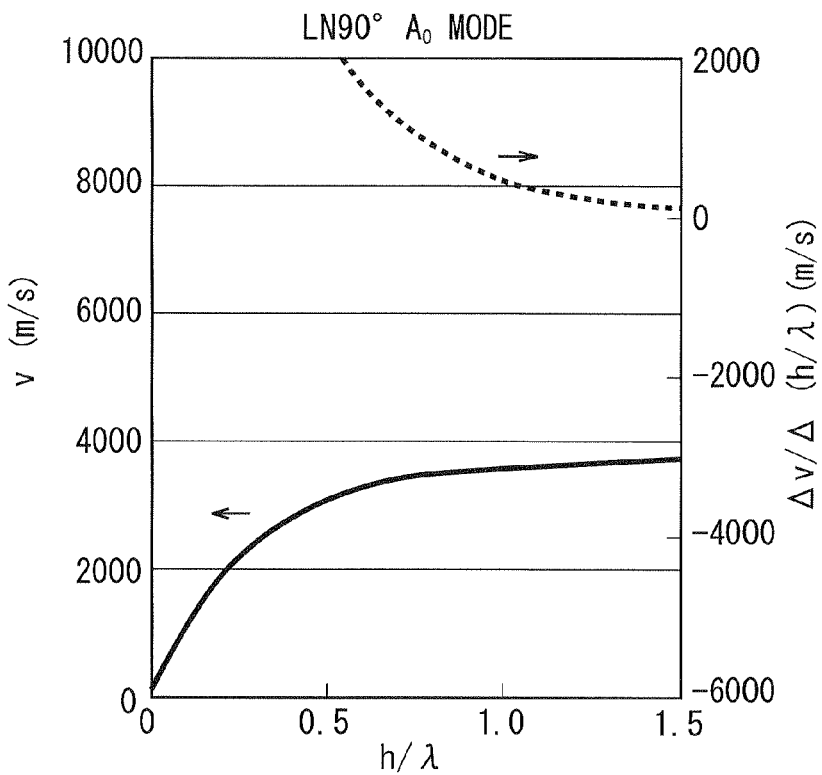
FIG. 6 is a dispersion curve of an $A_0$ mode in the case of the piezoelectric material being lithium niobate.
Figure 7:
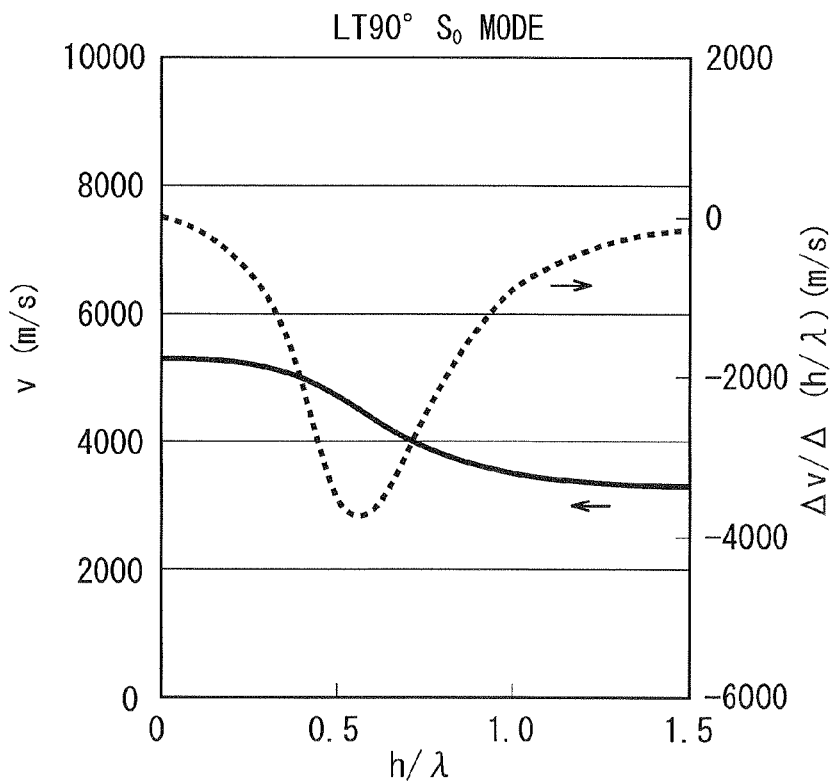
FIG. 7 is a dispersion curve of an $S_0$ mode in the case of the piezoelectric material being lithium tantalite.

This is described with reference to dispersion curves of FIGS. 3 to 7. FIGS. 3 to 6 show dispersion curves in a case where a piezoelectric material constituting the piezoelectric thin film 106 is lithium niobate (LN). FIG. 7 shows a dispersion curve in a case where the piezoelectric material constituting the piezoelectric thin film 106 is lithium tantalate. FIG. 3 shows a dispersion curve of an $S_0$ mode in a case of thinning a 90° Y plate, FIG. 4 shows a dispersion curve of an $S_0$ mode in a case of thinning a 0° Y plate, FIG. 5 shows a dispersion curve of an $A_1$ mode in the case of thinning the 90° Y plate, and FIG. 6 shows a dispersion curve of an $A_0$ mode in the case of thinning the 90° Y plate. FIG. 7 shows a dispersion curve of an $S_0$ mode in the case of thinning the 90° Y plate. A solid line in each of FIGS. 3 to 7 indicates dispersibility of the sonic velocity v with respect to the ratio $h/\lambda$, with the ratio $h/\lambda$ taken as an abscissa axis and the sonic velocity v as an ordinate axis (left side). A dotted line in each of FIGS. 3 to 7 indicates a change in change coefficient $\Delta v/\Delta (h/\lambda)$ by the ratio $h/\lambda$, with the ratio $h/\lambda$ taken as the abscissa axis and the change coefficient $\Delta v/\Delta (h/\lambda)$ as an ordinate axis (right side). When the vibration mode is the $S_0$ mode, as shown in FIGS. 3, 4 and 7, in the range of $h/\lambda \leq 1$ where degeneracy of the $S_0$ mode (zeroth symmetric mode) and the $A_0$ mode (zeroth antisymmetric mode) is lifted to allow excitation of the lamb wave, the sonic velocity v increases with decrease in ratio $h/\lambda$, but the increase gradually slows down. In the range of the ratio $h/\lambda$ not larger than 0.4, the absolute value of the change coefficient $\Delta v/\Delta (h/\lambda)$ is not larger than 2000 m/s. Therefore, when the piezoelectric material constituting the piezoelectric thin film 106 is a single crystal of lithium niobate or lithium tantalate, the film thickness h of the piezoelectric thin film 106 and the pitch p of the finger 110 of the IDT electrode 108 may be selected such that the ratio $h/\lambda$ is not larger than 0.4, so as to make the $S_0$ mode most strongly excited with a target frequency $f=v/\lambda$. Obviously, this specific range of "not larger than 0.4" differs depending upon the piezoelectric material constituting the piezoelectric thin film 106. However, that the film thickness h of the piezoelectric thin film 106 and the pitch p of the finger 110 of the IDT electrode 108 may be selected so as to make the ratio $h/\lambda$ is not larger than a threshold thereby to make the $S_0$ mode excited with the target frequency $f=v/\lambda$ also applies to the case of another piezoelectric material constituting the piezoelectric thin film 106. As opposed to this, when the vibration mode is other than the $S_0$ mode, as shown in FIGS. 5 and 6, the sonic velocity v increases or decreases with decrease in ratio $h/\lambda$, but that increase or decrease does not gradually slow down.

Figure 8:
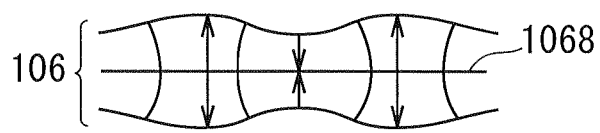
FIG. 8 is a sectional view explaining an vibration state of a piezoelectric thin film in a symmetric mode.
Figure 9:
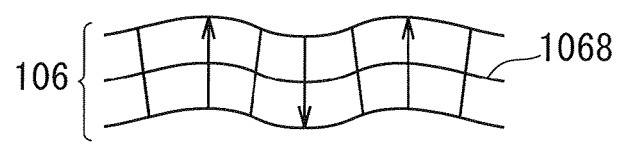
FIG. 9 is a sectional view explaining an vibration state of the piezoelectric thin film in an antisymmetric mode.

FIGS. 8 and 9 are views respectively explaining vibration states of the piezoelectric thin film 106 in the symmetric mode and the antisymmetric mode. FIGS. 8 and 9 are sectional views of the piezoelectric thin film 106. As shown in FIG. 8, in the symmetric mode, displacements indicated by arrows are symmetric with respect to a center 1068 of a thickness direction of the piezoelectric thin film 106. On the other hand, as shown in FIG. 9, in the antisymmetric mode, displacements indicated by arrows are antisymmetric with respect to the center 1068 of a thickness direction of the piezoelectric thin film 106. The lowest order vibration modes in such symmetric mode and antisymmetric mode are the $S_0$ mode and the $A_0$ mode, respectively.

Figure 10:
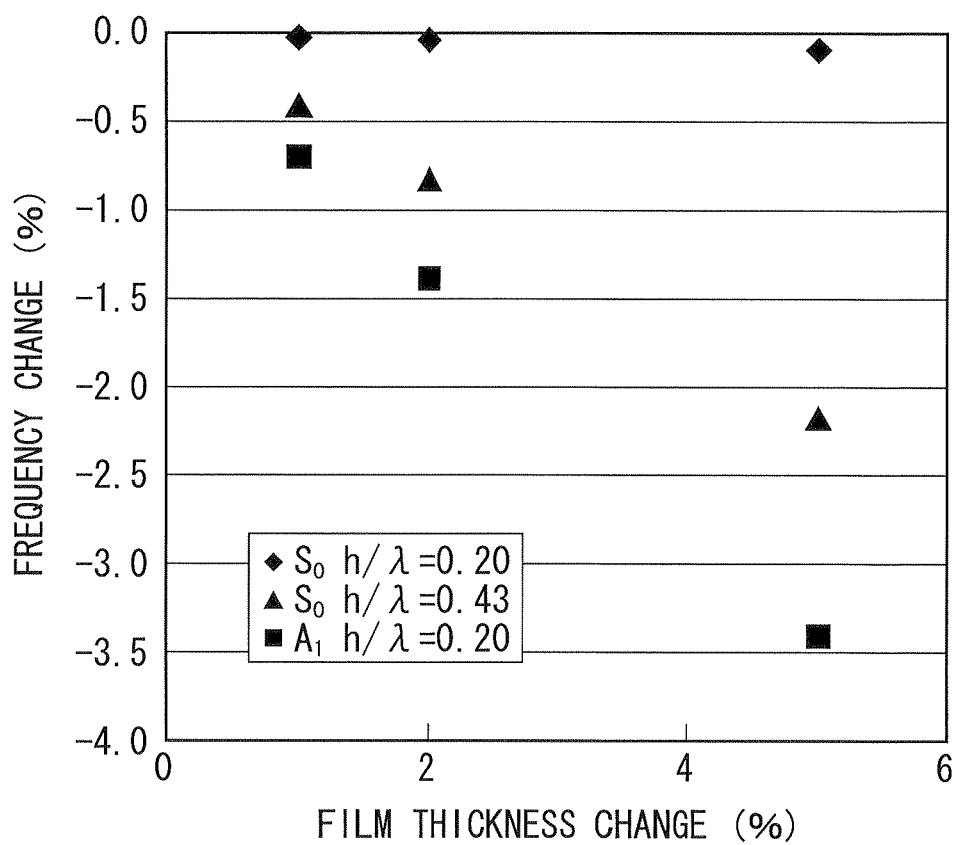
FIG. 10 is a diagram explaining an influence exerted by a ratio $h/\lambda$ and an vibration mode upon variations in frequency.

FIG. 10 is a diagram explaining an influence exerted by the ratio $h/\lambda$ and the vibration mode upon variations in frequency when the piezoelectric material constituting the piezoelectric thin film 106 is a single crystal of lithium niobate and the piezoelectric thin film 106 is one obtained by thinning the 90° Y plate. FIG. 10 is a graph showing dependency of the change in frequency change upon the change in film thickness in the case of the vibration mode being $S_0$ mode and $h/\lambda=0.20$, in the case of the vibration mode being $S_0$ mode and $h/\lambda=0.43$, and in the case of the vibration mode being $A_1$ mode and $h/\lambda=0.2$. As shown in FIG. 10, in the case of the vibration mode being $S_0$ mode and $h/\lambda=0.20$, the dispersibility of the sonic velocity v is small, and the change in frequency is thus not so large even with the change in film thickness being large, but in the case of the vibration mode being $S_0$ mode and $h/\lambda=0.43$ and in the case of the vibration mode being $A_1$ mode and $h/\lambda=0.20$, the dispersibility of the sonic velocity v is large, and the change in frequency is thus considerably large with the change in film thickness being large.

{Piezoelectric Thin Film 106}

Although the piezoelectric material constituting the piezoelectric thin film 106 is not particularly restricted, it may be selected from single crystals such as quartz ($SiO_2$), lithium niobate ($LiNbO_3$), lithium tantalate ($LiTaO_3$), lithium tetraborate ($Li_2B_4O_7$), zinc oxide (ZnO), potassium niobate (KNbO₃), langasite (La₃Ga₅SiO₁₄), aluminium nitride (AlN), and gallium nitride (GaN). This is because selecting the piezoelectric material from single crystals can improve an electromechanical coupling coefficient and a mechanical quality coefficient of the piezoelectric thin film 106.

A crystal orientation of the piezoelectric thin film 106 is desirably selected such that an etching rate of an under surface 1062 on the support structure 122 side of the piezoelectric thin film 106 to hydrofluoric acid is sufficiently slower than that of an under surface 1262 on the support substrate 124 side of the support film 126. The crystal orientation is more desirably selected such that the etching rate to hydrofluoric acid at 65° C. is not larger than one half, and particularly desirably selected such that the etching rate to hydrofluoric acid at 65° C. is not larger than one twentieth. It is to be noted that the same can also be said for the case of etching with a solution containing hydrogen fluoride such as buffered hydrofluoric acid or fluoronitric acid, other than hydrofluoric acid. Further, the same can also be said for the case of dry-etching with a gas containing hydrogen fluoride. Thereby, a piezoelectric substrate (mentioned later) to ultimately become the piezoelectric thin film 106 is hardly etched in formation of the cavity 180, thus reducing variations in film thickness of the piezoelectric thin film 106 and making variations in resonant frequency small. For example, when the piezoelectric thin film 106 is one obtained by thinning a θ°Y plate of lithium niobate, θ is desirably from 0 to 45 or from 128 to 180.

The piezoelectric thin film 106 covers all over the support substrate 124.

{IDT Electrode 108}

Although a conductive material constituting the IDT electrode 108 is not particularly restricted, it is desirably selected from aluminum (Al), Molybdenum (Mo), tungsten (W), gold (Au), platinum (Pt), silver (Ag), copper (Cu), titanium (Ti), chromium (Cr), ruthenium (Ru), vanadium (V), niobium (Nb), tantalum (Ta), rhodium (Rh), iridium (Ir), zirconium (Zr), hafnium (Hf), palladium (Pd), and an alloy mainly composed of those, and particularly desirably selected from aluminum or an alloy mainly composed of aluminum.

The IDT electrode 108 is provided on the top surface of the piezoelectric thin film 106. It should be noted that the IDT electrode 108 may also be provided on the under surface of the piezoelectric thin film 106.

The IDT electrode 108 is provided with: fingers 110 that apply an electric field to the piezoelectric thin film 106 and also collect a surface electric charge generated on the surface of the piezoelectric thin film 106; and bus bars 116 that connect the fingers 110. The fingers 110 are provided in an extended manner in a vertical direction to a propagation direction of the lamb wave, and uniformly arrayed in the propagation direction of the lamb wave. The bus bars 116 are provided in an extended manner in the propagation direction of the lamb wave. The fingers 110 are made up of a first finger 112 connected to a first bus bar 118 on the one side end and a second finger 114 connected to a second bus bar 120 on the other side end, and the first finger 112 and the second finger 114 are alternately arrayed. Thereby, the IDT electrode 108 transmits a lamb wave in accordance with a signal inputted to between the first finger 112 and the second finger 114, and also transmits a signal in accordance with the received lamb wave to between the first finger 112 and the second finger 114.

A double-phase type IDT electrode 108 with the alternately arrayed first finger 112 and second finger 114 having different phases most strongly excite a lamb wave with a wavelength λ twice as large as the pitch p of the finger 110. Therefore, in the case of the double phase-type IDT electrode 108 exciting a lamb wave, "the ratio h/λ is not larger than 0.4" described above means "the ratio h/p of the film thickness h to the pitch p is not larger than 0.8".

The lamb wave excited by the IDT electrode 108 is reflected on the end surface of the cavity region, and the lamb wave device 102 functions as a piezoelectric resonator. It is to be noted that the IDT electrode 108 may be sandwiched between reflector electrodes from both sides of the propagation direction of the lamb wave. Further, the lamb wave device 102 may be configured as a filter duplexer or the like obtained by combining a plurality of piezoelectric resonators, or the lamb wave device 102 may be configured as a sensor or the like. Typically, the "lamb wave device" means an electronic component in general which excites a lamb wave in a piezoelectric thin film, and uses an electric response by the lamb wave. The "lamb wave" is a wave which is configured of a longitudinal wave (L wave) and a shear vertical wave (SV wave) having displacement components inside a propagation surface, and propagates while the longitudinal wave and the shear vertical wave are bound by a condition of a boundary between the top surface and the under surface.

{Support Substrate 124}

Although an insulating material constituting the support substrate 124 is not particularly restricted, it is preferably selected from: simple substances of the IV group elements such as silicon (Si) and germanium (Ge); simple oxides such as sapphire (Al₂O₃), magnesium oxide (MgO), zinc oxide (ZnO), and silicon dioxide (SiO₂); borides such as zirconium diboride (ZrB₂); complex oxides such as lithium tantalate (LiTaO₃), lithium niobate (LiNbO₃), lithium aluminate (LiAlO₂), gallium lithium (LiGaO₂), spinel (MgAl₂O₄), lanthanum strontium lithium aluminate tantalate ((LaSr)(AlTa)O₃), and neodymium gallate (NdGaO₃); IV-IV group compounds such as silicon germanium (SiG); III-IV group compounds such as gallium arsenide (GaAs), aluminium nitride (AlN), gallium nitride (GaN), aluminum gallium nitride (AlGaN); and the like.

{Support Film 126}

Although an insulating material constituting the support film 126 is not particularly restricted, it is desirable to select silicon dioxide. The support film 126 is generally provided outside the cavity region, its under surface is in contact with the top surface of the support substrate 124, and its top surface is in contact with the under surface 1062 of the piezoelectric thin film 106. The support film 126 serves as a spacer for isolating the laminate 104 from the support substrate 124 in the cavity region.

<1-2 Manufacturing Method for Lamb Wave Device 102>

Figure 11:
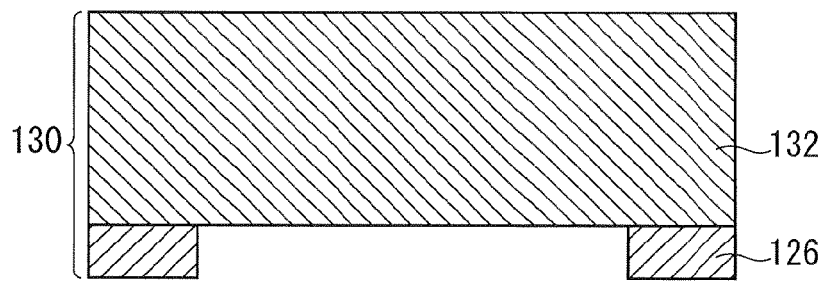
FIGS. 11 to 13 are sectional views each explaining a manufacturing method for the lamb wave device according to the first embodiment.
Figure 12:
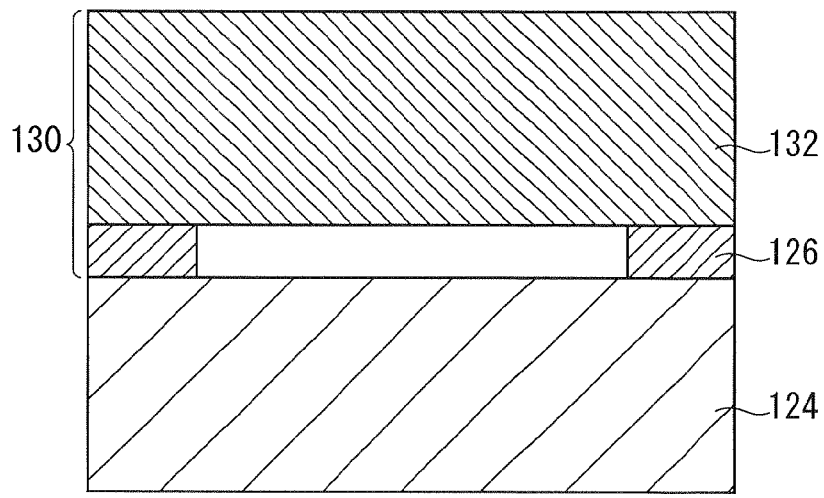
Figure 13:
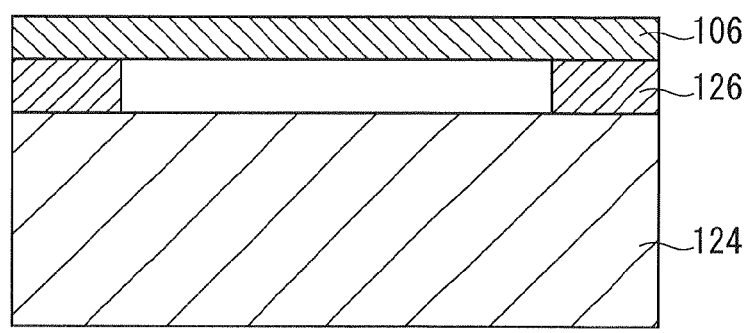

FIGS. 11 to 13 are schematic views each explaining a manufacturing method for the lamb wave device 102. FIGS. 11 to 13 are sectional views of work-in-process products that are in the process of manufacturing.

{Production of Plate Structure 130}

In manufacturing of the lamb wave device 102, first, as shown in FIG. 11, a plate structure 130 is produced in which the support film 126 is formed on the under surface of a piezoelectric substrate 132. The support film 126 is formed by forming a film of the insulating material to constitute the support film 126 all over the under surface of the piezoelectric substrate 132 and removing an unnecessary part of the film by etching with hydrofluoric acid. At this time, if an etching rate of the piezoelectric substrate 132 to ultimately become the piezoelectric thin film 106 to hydrofluoric acid is sufficiently slower than that of the support film 126, the piezoelectric substrate 132 is hardly etched in formation of the cavity 180 with hydrofluoric acid.

Figures 14, 15:
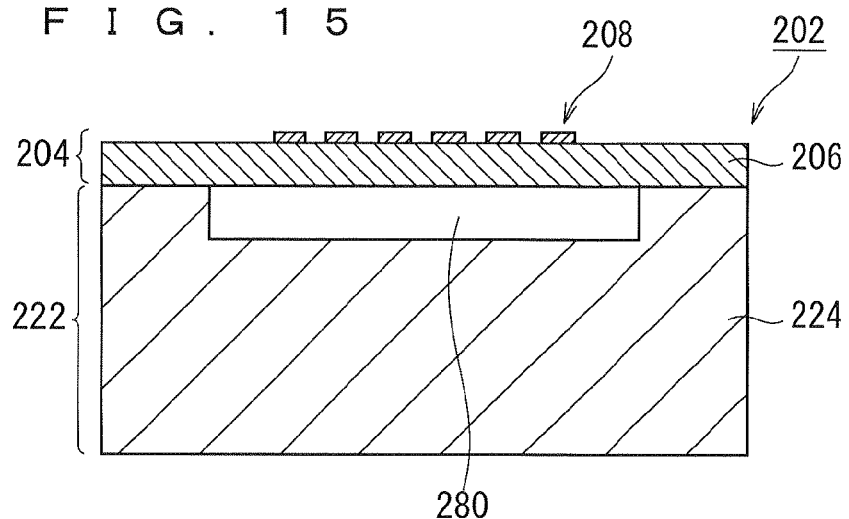
FIG. 14 is a diagram showing the relation between an etching rate ratio and variations in frequency.
FIG. 15 is a sectional view of a lamb wave device of a second embodiment.

FIG. 14 is a diagram showing the relation between a ratio of the etching rate of the piezoelectric substrate 132 to later become the piezoelectric thin film 106 to the etching rate of the support film 126 (hereinafter referred to as an "etching rate ratio"), and variations in frequency. FIG. 14 also shows the insulating material constituting the support film 126, and the piezoelectric material constituting the piezoelectric substrate 132 (the piezoelectric material constituting the piezoelectric thin film 106). "LN36", "LN45" and "LN90" shown in FIG. 14 respectively mean a 36° Y plate, a 45° Y plate and a 90° Y plate of a single crystal of lithium niobate (LN). FIG. 14 shows the relation in the case of forming the support film 126 on a −Z plane of the piezoelectric substrate 132. Etching was performed by soaking a work-in-process product obtained by forming a film of the insulating material constituting the support film 126 all over the under surface of the piezoelectric substrate 132 into hydrofluoric acid adjusted to a temperature of 65° C. and containing hydrogen fluoride at a concentration of 50%. The temperature of hydrofluoric acid was adjusted by heating hydrofluoric acid poured into a beaker made of a fluorocarbon resin inside a constant temperature bath. The work-in-process product was soaked into hydrofluoric acid after stabilization of the temperature of hydrofluoric acid. The depth of the cavity was measured using a contact type step measuring device. In addition, although the temperature at which the etching is performed is not necessarily "65° C." so long as being constantly kept, when the temperature is "65° C.", the etching rate is fast and the time required for etching is short. As shown in FIG. 14, the smaller the etching rate ratio, the smaller the variations in frequency, and the variations in frequency was the smallest when the insulating material constituting the support film 126 was silicon dioxide and the piezoelectric material constituting the piezoelectric substrate 132 (piezoelectric thin film 106) was 36° Y plate of the single crystal of lithium niobate.

{Bonding of Plate Structure 130 and Support Substrate 124}

After production of the plate structure 130, as shown in FIG. 12, the under surface of the plate structure 130 and the top surface of the support substrate 124 are bonded. Although the bonding between the plate structure 130 and the support substrate 124 is not particularly restricted, it is for example performed by surface activation bonding, adhesive bonding, thermo-compression bonding, anode bonding, eutectic bonding, or the like.

{Removal Processing on Piezoelectric Substrate 132}

After bonding of the plate structure 130 and the support substrate, as shown in FIG. 13, the piezoelectric substrate 132 is subjected to removal processing while the plate structure 130 and the support substrate 124 are kept in a bonded state, and the piezoelectric substrate 132, having a plate thickness (e.g. not smaller than 50 μm) that can single-handedly sustain its own weight, is made thinner to a film thickness (e.g. not larger than 10 μm) that cannot single-handedly sustain its own weight. Thereby, the piezoelectric thin film 106 covering all over the top surface of the support substrate 124 is formed.

The removal processing is performed on the piezoelectric substrate 132 by mechanical processing such as cutting, grinding and polishing, and chemical processing such as etching. Here, when a plurality of removal processing methods are combined and the removal processing is performed on the piezoelectric substrate 132 while being switched from a removal processing method with high processing rate to a removal processing method with small processing degeneration that occurs in a processing object, it is possible to improve the quality of the piezoelectric thin film 106 so as to improve characteristics of the lamb wave device 102 while maintaining high productivity. For example, it is desirable that, after the piezoelectric substrate 132 is sequentially subjected to grinding by being brought into contact with a fixed abrasive particle and ground and to polishing by being brought into contact with a free abrasive particle and ground, a processed degenerated layer generated in the piezoelectric substrate 132 by the polishing be removed by finish polishing.

{Formation of IDT Electrode 108}

After the removal processing on the piezoelectric substrate 132, the IDT electrode 108 is formed on the top surface of the piezoelectric thin film 106, to complete the lamb wave device 102 shown in FIGS. 1 and 2. The IDT electrode 108 is formed by forming a conductive material covering all over the top surface of the piezoelectric thin film 106 and removing an unnecessary part of the conductive material film by etching.

According to this manufacturing method for the lamb wave device 102, differently from the case of forming the piezoelectric thin film 106 by sputtering or the like, the piezoelectric material constituting the piezoelectric thin film 106 and the crystal orientation of the piezoelectric thin film 106 are not restricted by the substrate, and hence the degree of freedom is high in selection of the piezoelectric material constituting the piezoelectric thin film 106 and the crystal orientation of the piezoelectric thin film 106. This facilitates realization of a desired characteristic of the lamb wave device 102.

{Others}

In the case of providing the IDT electrode on the under surface of the piezoelectric thin film 106, the IDT electrode may be formed on the under surface of the piezoelectric substrate 132 prior to formation of the support film 126.

2 Second Embodiment

<2-1 Configuration of Lamb Wave Device 202>

A second embodiment relates to a lamb wave device 202 where, in place of the support structure 122 of the first embodiment, a support structure 222 supports a laminate 204 provided with a piezoelectric thin film 206 and an IDT electrode 208 in the same manner as in the first embodiment. FIG. 15 is a schematic view of the lamb wave device 202 of the second embodiment. FIG. 15 is a sectional view of the lamb wave device 202.

As shown in FIG. 15, the support structure 222 is provided with the support substrate 224, but is not provided with a support film. In the support substrate 224 formed is a cavity 280 for isolating an excitation section of the laminate 204 from the support substrate 224.

<2-2 Manufacturing Method for Lamb Wave Device 202>

Figure 16:
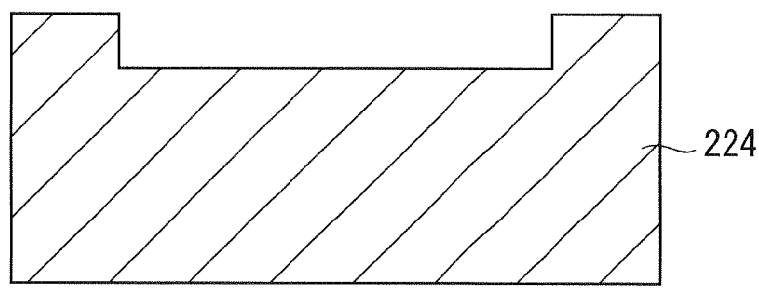
FIGS. 16 to 18 are sectional views each explaining a manufacturing method for the lamb wave device according to the second embodiment.
Figure 17:
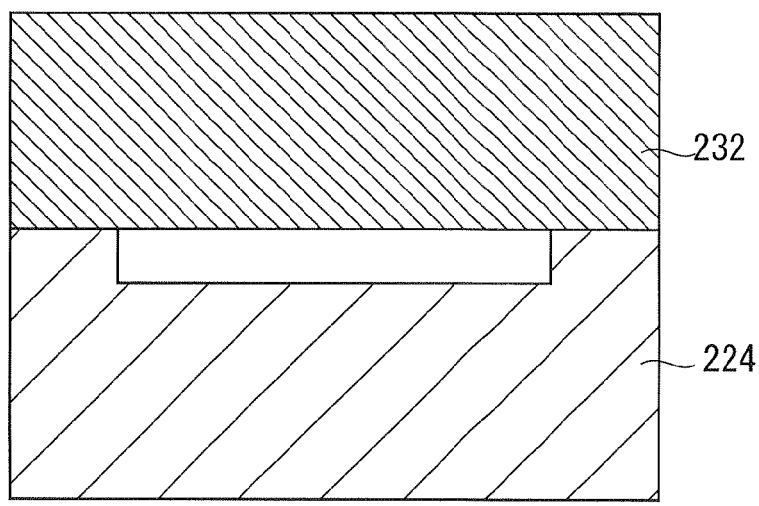
Figure 18:
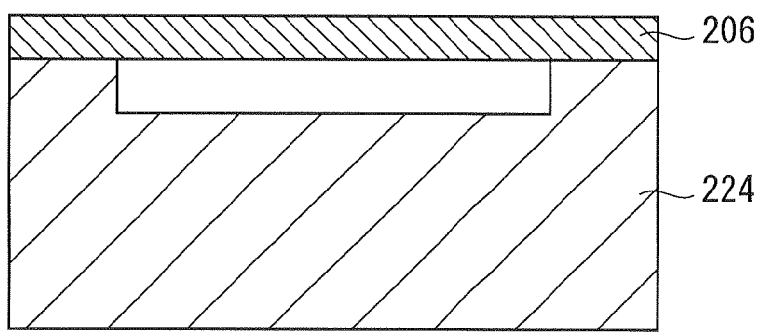

FIGS. 16 to 18 are sectional views each explaining a manufacturing method for the lamb wave device 202. FIGS. 16 to 18 are sectional views of work-in-process products in the process of manufacturing.

{Production of Support Substrate 224}

In manufacturing of the lamb wave device 202, first, as shown in FIG. 16, the top surface of a material substrate is etched, to produce the support substrate 224 with the cavity 280 formed therein.

{Bonding of Piezoelectric Substrate 232 and Support Substrate 224}

After production of the plate structure, as shown in FIG. 17, the under surface of the piezoelectric substrate 232 and the top surface of the support substrate 224 are bonded. The piezoelectric substrate 232 and the support substrate 224 are bonded in the same manner as in the case of the first embodiment.

{Removal Processing on Piezoelectric Substrate 232}

After bonding of the piezoelectric substrate 232 and the support substrate 224, as shown in FIG. 18, the piezoelectric substrate 232 is subjected to removal processing while the piezoelectric substrate 232 and the support substrate 224 are kept in a bonded state, to obtain the piezoelectric thin film 206. The removal processing is performed on the piezoelectric substrate 232 in the same manner as in the case of the first embodiment.

{Formation of IDT Electrode 208}

After the removal processing on the piezoelectric substrate 232, the IDT electrode 208 is formed on the top surface of the piezoelectric thin film 206, to complete the lamb wave device 202 shown in FIG. 15. The IDT electrode 208 is formed in the same manner as in the case of the first embodiment.

According to this manufacturing method for the lamb wave device 202, differently from the case of forming the piezoelectric thin film 206 by sputtering or the like, the piezoelectric material constituting the piezoelectric thin film 206 and the crystal orientation of the piezoelectric thin film 206 are not restricted by the substrate, and hence the degree of freedom is high in selection of the piezoelectric material constituting the piezoelectric thin film 206 and the crystal orientation of the piezoelectric thin film 206. This facilitates realization of a desired characteristic of the lamb wave device 202.

{Others}

In the case of providing the IDT electrode on the under surface of the piezoelectric thin film 206, the IDT electrode may be formed on the under surface of the piezoelectric substrate 232 prior to bonding of the piezoelectric substrate 232 and the support substrate 224.

3 Third Embodiment

Figure 19:
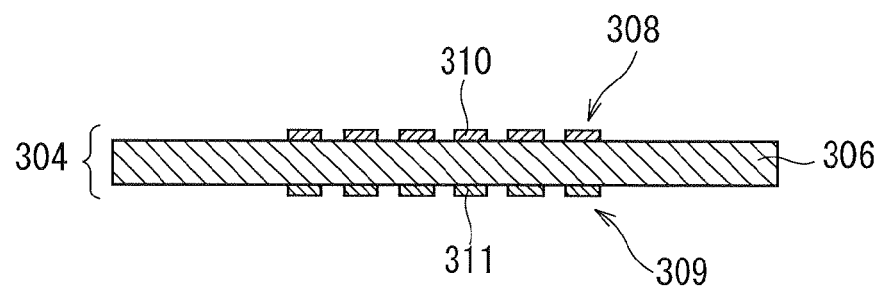
FIG. 19 is a sectional view of a laminate of a third embodiment.

A third embodiment relates to a laminate 304 that can be adopted in place of the laminate 104 of the first embodiment, the laminate 204 of the second embodiment and a laminate 504 of a fifth embodiment. FIG. 19 is a schematic view of the laminate 304 of the third embodiment. FIG. 19 is a sectional view of the laminate 304.

As shown in FIG. 19, the laminate 304 is provided with an IDT electrode 309 in addition to a piezoelectric thin film 306 and an IDT electrode 308 which are similar to the piezoelectric thin film 106 and the IDT electrode 108 of the first embodiment. The IDT electrode 309 is provided on the under surface of the piezoelectric thin film 306. The IDT electrode 309 has a similar plane shape to the IDT electrode 308, and is provided in a position opposed to the IDT electrode 308. A finger 310 of the opposed IDT electrode 308 and a finger 311 of the IDT electrode 309 have the same phase.

Also in the case of adopting such IDT electrodes 308, 309, a lamb wave with a wavelength λ twice as large as the pitch p of each of the fingers 310, 311 is most strongly excited. Therefore, "the ratio h/λ is not larger than 0.4" described above means "the ratio h/p of the film thickness h to the pitch p is not larger than 0.8".

4 Fourth Embodiment

Figure 20:
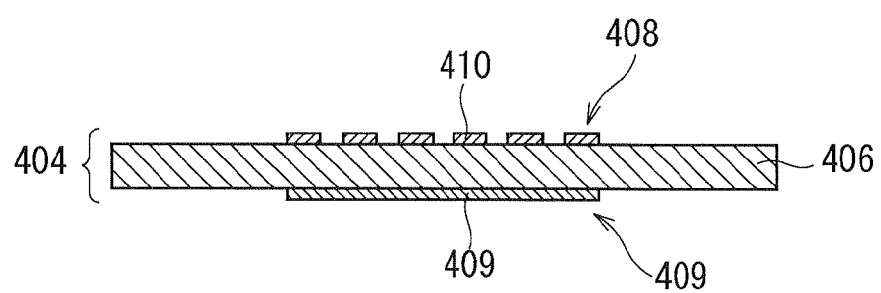
FIG. 20 is a sectional view of a laminate of a fourth embodiment.

A fourth embodiment relates to a laminate 404 that can be adopted in place of the laminate 104 of the first embodiment, the laminate 204 of the second embodiment and the laminate 504 of the fifth embodiment. FIG. 20 is a schematic view of the laminate 404 of the fourth embodiment.

As shown in FIG. 20, the laminate 404 is provided with a surface electrode 409 in addition to a piezoelectric thin film 406 and an IDT electrode 408 which are similar to the piezoelectric thin film 106 and the IDT electrode 108 of the first embodiment. The surface electrode 409 is provided on the under surface of the piezoelectric thin film 406. The surface electrode 409 is provided in a position opposed to the IDT electrode 408. The surface electrode 409 may be grounded, or electrically floated without being connected to anywhere.

Also in the case of adopting such an IDT electrodes 408, a lamb wave with a wavelength λ, twice as large as the pitch p of the finger 410 is most strongly excited. Therefore, "the standardized film thickness h/λ is not larger than 0.4" described above means "the ratio h/p of the film thickness h to the pitch p is not larger than 0.8".

5 Fifth Embodiment

<5-1 Configuration of Lamb Wave Device 502>

Figure 21:
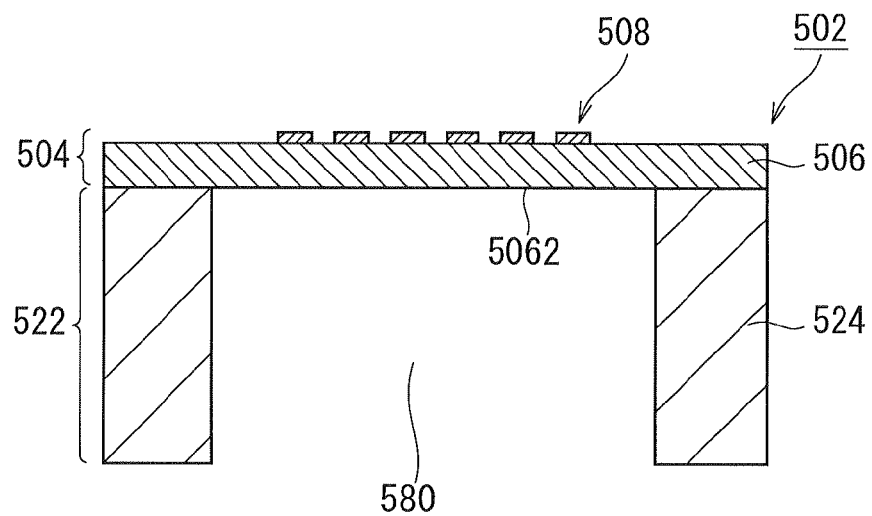
FIG. 21 is a sectional view of a lamb wave device of a fifth embodiment.

A fifth embodiment relates to a lamb wave device 502 where, in place of the support structure 122 of the first embodiment, a support structure 522 supports a laminate 504 provided with a piezoelectric thin film 506 and an IDT electrode 508 in the same manner as in the first embodiment. FIG. 21 is a schematic view of the lamb wave device 502 of the fifth embodiment. FIG. 21 is a sectional view of the lamb wave device 502.

As shown in FIG. 21, the support structure 522 is provided with the support substrate 524, but is not provided with a support film. In the support substrate 524 formed is a cavity 580 for isolating an excitation section of the laminate 504 from the support substrate 524. Differently from the cavity 280 of the lamb wave device 202, the cavity 580 of the lamb wave device 502 penetrates the top and under surfaces of the support substrate 524.

A crystal orientation of the piezoelectric thin film 506 is desirably selected such that an etching rate of an under surface 5062 on the support structure 522 side of the piezoelectric thin film 506 to hydrofluoric acid is sufficiently slower than that of an under surface 5242 on the opposite side to the piezoelectric thin film 506 side of the support substrate 524. The crystal orientation is more desirably selected such that the etching rate to hydrofluoric acid at 65° C. is not larger than one half, and particularly desirably selected such that the etching rate to hydrofluoric acid at 65° C. is not larger than one twentieth. It is to be noted that the same can also be said for the case of etching with a solution containing hydrogen fluoride such as buffered hydrofluoric acid or fluoronitric acid, other than hydrofluoric acid. Further, the same can also be said for the case of dry-etching with a gas containing hydrogen fluoride. Thereby, the piezoelectric thin film 506 is hardly etched in formation of the cavity 580, thus reducing variations in film thickness of the piezoelectric thin film 106 and making variations in resonant frequency small. For example, when the piezoelectric thin film 506 is one obtained by thinning the θ° Y plate of lithium niobate, θ is desirably from 0 to 45 or from 128 to 180.

For formation of the cavity 580 that is a through hole, a material for the support substrate 524 is desirably lithium tantalate ($LiTaO_3$), lithium niobate ($LiNbO_3$), silicon dioxide ($SiO_2$), silicon (Si), and the like, which are easy to etch by a solution containing hydrogen fluoride or a gas containing hydrogen fluoride.

<5-2 Manufacturing Method for Lamb Wave Device 502>

Figure 22:
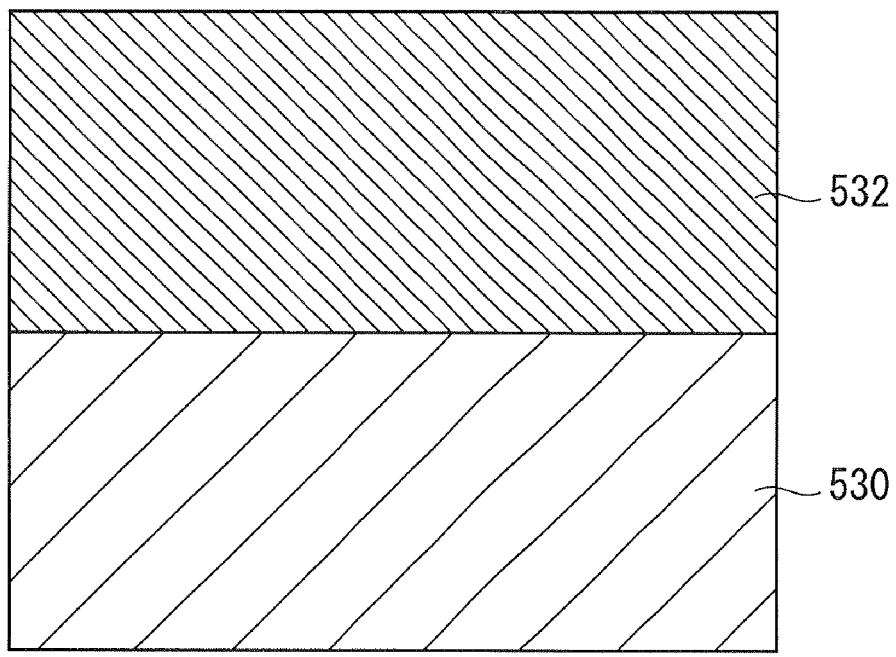
FIGS. 22 to 24 are sectional views each explaining a manufacturing method for the lamb wave device according to the fifth embodiment.
Figure 23:
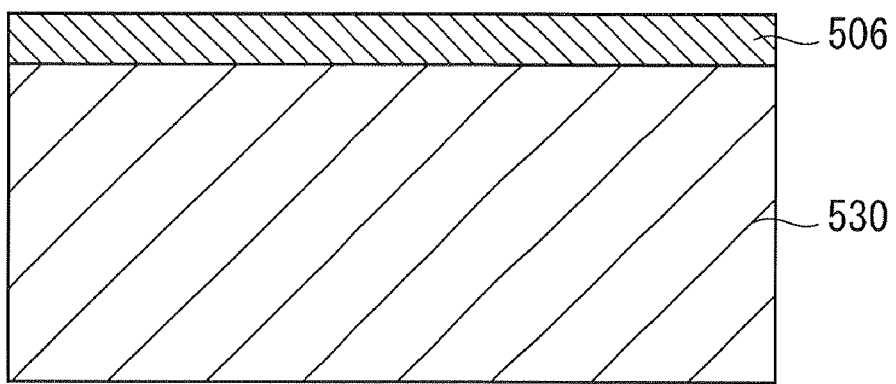
Figures 24, 25:
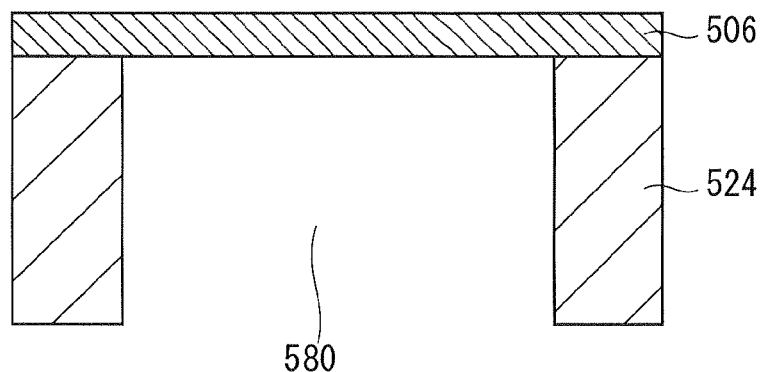
FIG. 25 is a diagram showing the relation between an etching rate ratio and variations in frequency.

FIGS. 22 to 24 are schematic views each explaining a manufacturing method for the lamb wave device 502. FIGS. 22 to 24 are sectional views of work-in-process products that are in the process of manufacturing.

{Bonding of Piezoelectric Substrate 532 and Material Substrate 530}

In manufacturing of the lamb wave device 502, first, as shown in FIG. 22, the under surface of the piezoelectric substrate 532 and the top surface of the material substrate 530 to ultimately become the support substrate 524 are bonded. The piezoelectric substrate 532 and the material substrate 530 are bonded in the same manner as in the case of the first embodiment.

{Removal Processing on Piezoelectric Substrate 532}

After bonding of the piezoelectric substrate 532 and the material substrate 530, as shown in FIG. 23, the piezoelectric substrate 532 is subjected to removal processing while the piezoelectric substrate 532 and the material substrate 530 are kept in a bonded state, to obtain the piezoelectric thin film 506. The removal processing is performed on the piezoelectric substrate 532 in the same manner as in the case of the first embodiment.

{Production of Support Substrate 524}

After the removal processing on the piezoelectric substrate 532, as shown in FIG. 24, the support substrate 524 is produced in which the cavity 580 is formed by etching the material substrate 530 from the under surface side thereof. If an etching rate of the piezoelectric thin film 506 to hydrofluoric acid is sufficiently slower than that of the material substrate 530, the piezoelectric thin film 506 is hardly etched in formation of the cavity 580 with hydrofluoric acid. It should be noted that the cavity 580 may be formed after formation of the IDT electrode 508.

FIG. 25 is a diagram showing the relation between a ratio of the etching rate of the material substrate 530 to later become the support substrate 524 to an etching rate of the piezoelectric thin film 506 (hereinafter referred to as an "etching rate ratio"), and variations in frequency. FIG. 25 also shows the insulating material constituting the support substrate 524 (the insulating material constituting the material substrate 530), and the piezoelectric material constituting the piezoelectric thin film 506. "LN36" shown in FIG. 25 means a 36° Y plate of a single crystal of lithium niobate (LN), and "LT36", "LT40" and "LT42" respectively mean a 36° Y plate, a 40° Y plate and a 42° Y plate of a single crystal of lithium tantalate (LT). FIG. 25 shows the relation in the case of a −Z plane of the piezoelectric thin film 506 and a +Z plane of the material substrate 530 being bonded. The etching procedure and conditions are the same as in the case of the first embodiment. As shown in FIG. 25, the smaller the etching rate ratio, the smaller the variations in frequency, and the variations in frequency was the smallest when the piezoelectric material constituting the piezoelectric thin film 506 is the 36° Y plate of single crystal of lithium niobate.

{Formation of IDT Electrode 508}

After production of the support substrate 524, the IDT electrode 508 is formed on the top surface of the piezoelectric thin film 506, to complete the lamb wave device 502 shown in FIG. 21. The IDT electrode 508 is formed in the same manner as in the case of the first embodiment.

According to this manufacturing method for the lamb wave device 502, differently from the case of forming the piezoelectric thin film 506 by sputtering or the like, the piezoelectric material constituting the piezoelectric thin film 506 and the crystal orientation of the piezoelectric thin film 506 are not restricted by the substrate, and hence the degree of freedom is high in selection of the piezoelectric material constituting the piezoelectric thin film 506 and the crystal orientation of the piezoelectric thin film 506. This facilitates realization of a desired characteristic of the lamb wave device 502.

6 Others

While the present invention has been shown and described in detail, the foregoing description is in all aspects illustrative and not restrictive. It is therefore understood that numerous modifications and variations can be devised without departing from the scope of the invention. In particular, combining descriptions given in the first to fifth embodiments are obviously counted.

What is claimed is:

1. A lamb wave device, comprising:
a piezoelectric thin film;
an IDT electrode which is provided on a main surface of said piezoelectric thin film; and
a support structure which supports a laminate of said piezoelectric thin film and said IDT electrode, wherein
a film thickness h of said piezoelectric thin film and a pitch p of a finger of said IDT electrode are selected such that a lamb wave, with which an absolute value of a change coefficient $\Delta v/\Delta (h/\lambda)$ of a sonic velocity v with respect to a ratio $h/\lambda$ of said film thickness h of said piezoelectric thin film to a wavelength $\lambda$ is not larger than 2000 m/s, is excited at a target frequency.

2. The lamb wave device according to claim 1, wherein a vibration mode of the lamb wave is an $S_0$ mode.

3. The lamb wave device according to claim 1, wherein said support structure includes:
a support substrate; and
a support film which bonds said support substrate and said laminate, and is also formed with a cavity that isolates an excitation section of said laminate from said support substrate, and wherein
an orientation of said piezoelectric thin film is selected such that an etching rate of the main surface on said support structure side of said piezoelectric thin film to a solution containing hydrogen fluoride or a gas containing hydrogen fluoride at 65° C. is not larger than one half of that of the main surface on said support substrate side of said support film.

4. The lamb wave device according to claim 3, wherein the orientation of said piezoelectric thin film is selected such that the etching rate of the main surface on said support structure side of said piezoelectric thin film to the solution containing hydrogen fluoride or the gas containing hydrogen fluoride at 65° C. is not larger than one twentieth of that of the main surface on said support substrate side of said support film.

5. The lamb wave device according to claim 1, wherein said support structure includes
a support substrate, and wherein
an orientation of said piezoelectric thin film is selected such that an etching rate of the main surface on said support structure side of said piezoelectric thin film to a solution containing hydrogen fluoride or a gas containing hydrogen fluoride at 65° C. is not larger than one half of that of the main surface on the opposite side to said piezoelectric thin film side of said support substrate.

6. The lamb wave device according to claim 5, wherein the orientation of said piezoelectric thin film is selected such that the etching rate of the main surface on said support structure side of said piezoelectric thin film to the solution containing hydrogen fluoride or the gas containing hydrogen fluoride at 65° C. is not larger than one twentieth of that of the main surface on the opposite side to said piezoelectric thin film side of said support substrate.

* * * * *